US006619788B2

(12) United States Patent
Condie

(10) Patent No.: US 6,619,788 B2
(45) Date of Patent: Sep. 16, 2003

(54) DROPLET DEPOSITION APPARATUS

(75) Inventor: Angus Condie, Cambridge (GB)

(73) Assignee: Xaar Technology Limited, Cambridge (GB)

(*) Notice: Subject to any disclaimer, the term of this patent is extended or adjusted under 35 U.S.C. 154(b) by 0 days.

(21) Appl. No.: 09/906,323

(22) Filed: Jul. 16, 2001

(65) Prior Publication Data

US 2002/0071007 A1 Jun. 13, 2002

Related U.S. Application Data

(63) Continuation of application No. PCT/GB00/00173, filed on Jan. 24, 2000.

(30) Foreign Application Priority Data

Feb. 1, 1999 (GB) .......................................... 9902188

(51) Int. Cl.[7] ......................... B41J 2/045; H01L 41/04; H01L 41/08; H01L 41/18

(52) U.S. Cl. ......................................... 347/69; 310/358

(58) Field of Search ............................ 347/69; 310/358

(56) References Cited

U.S. PATENT DOCUMENTS

| | | | | |
|---|---|---|---|---|
| 4,449,134 A | | 5/1984 | Skinner, Jr. | 347/75 |
| 4,887,100 A | | 12/1989 | Michaelis et al. | 347/69 |
| 5,318,725 A | | 6/1994 | Sandhage | 252/520 |
| 5,340,510 A | | 8/1994 | Bowen | 264/22 |
| 5,788,876 A | | 8/1998 | Chen | 252/62.9 PZ |
| 5,951,908 A | * | 9/1999 | Cui et al. | 252/62.9 |

FOREIGN PATENT DOCUMENTS

| | | | |
|---|---|---|---|
| EP | 0 277 703 A1 | 8/1988 | B41J/3/04 |
| WO | WO 91/17051 | 11/1991 | B41J/2/16 |
| WO | WO 92/17420 | 10/1992 | C04B/35/00 |

OTHER PUBLICATIONS

International Search Report for PCT/GB00/00173 dated Mar. 29, 2000.

International Preliminary Examination Report for PCT/GB00/00173 dated Dec. 8, 2000.

* cited by examiner

*Primary Examiner*—Judy Nguyen
*Assistant Examiner*—Alfred Dudding
(74) *Attorney, Agent, or Firm*—Marshall, Gerstein & Borun

(57) ABSTRACT

An accepter-doped "hard" PZT is used in a piezoelectric print head instead of the conventional "soft" donor-doped material. The print head preferably is of a chevron side-shooter configuration and is advantageous for high-definition grey-scale printing.

8 Claims, 6 Drawing Sheets

FIG. 5 Variation in Hysteresis loss for different PZTs and different waveforms @ 200kHz
Peak voltage = 30V
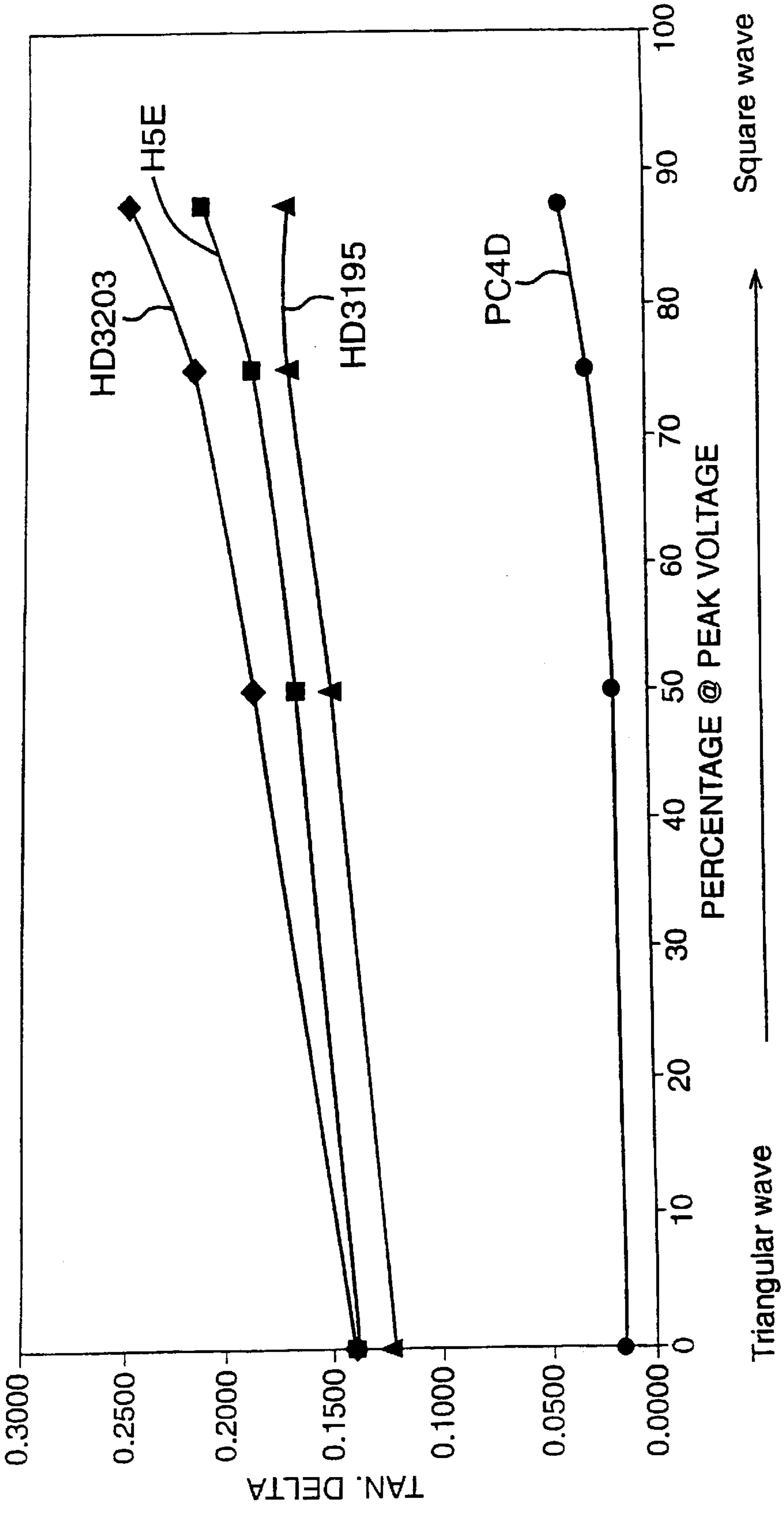

FIG. 6 Relative heat generation for alternative PZT and different printhead constructions
Relative to Motorola HD 3203, monolithic cantilever (100%) - total heat = 2.81 W/Chip, Drive voltage = 25.00V
"Square" waveform: Voltage at peak for 75% of cycle (e.g. Rise time = 475ns)
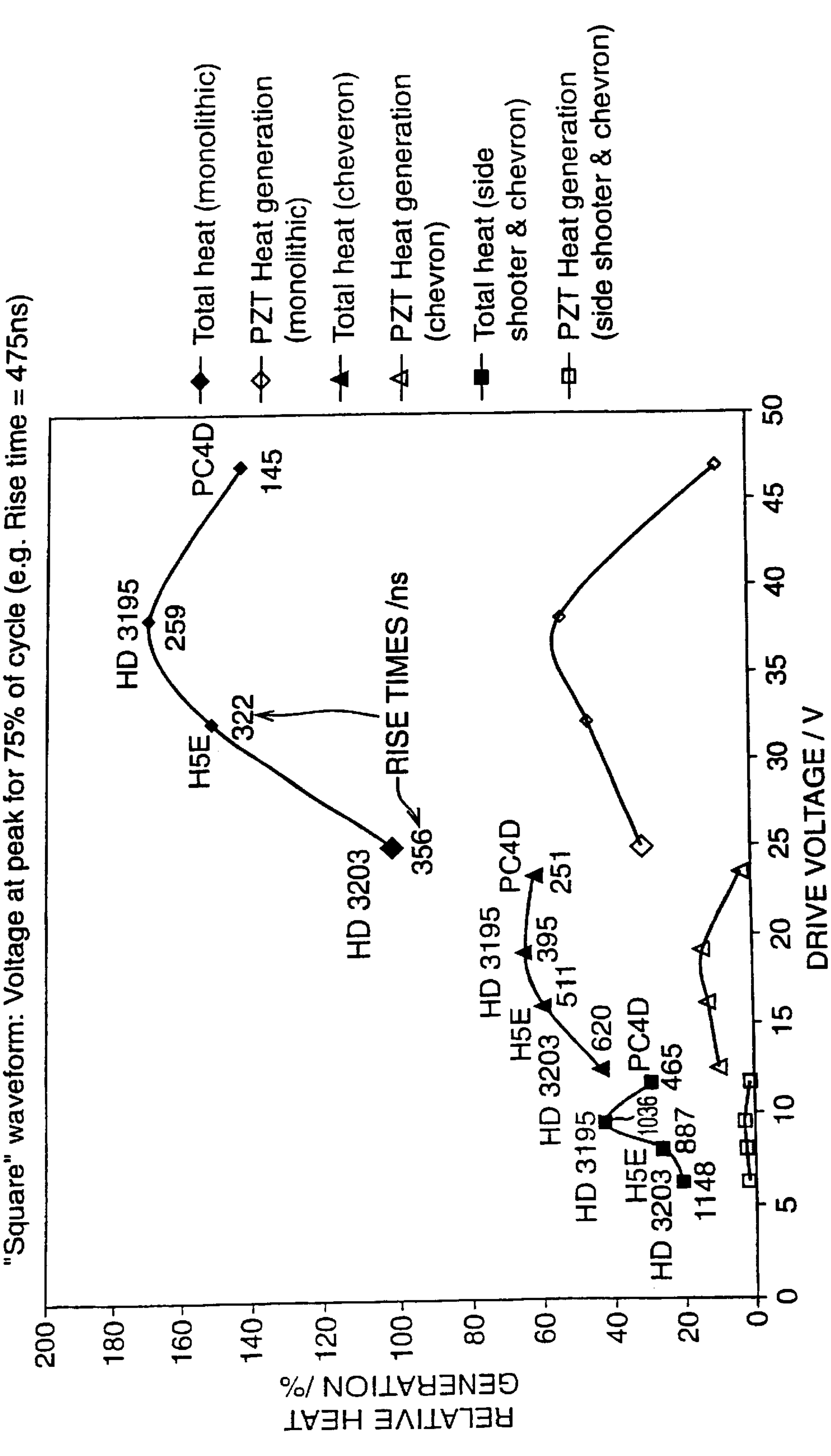

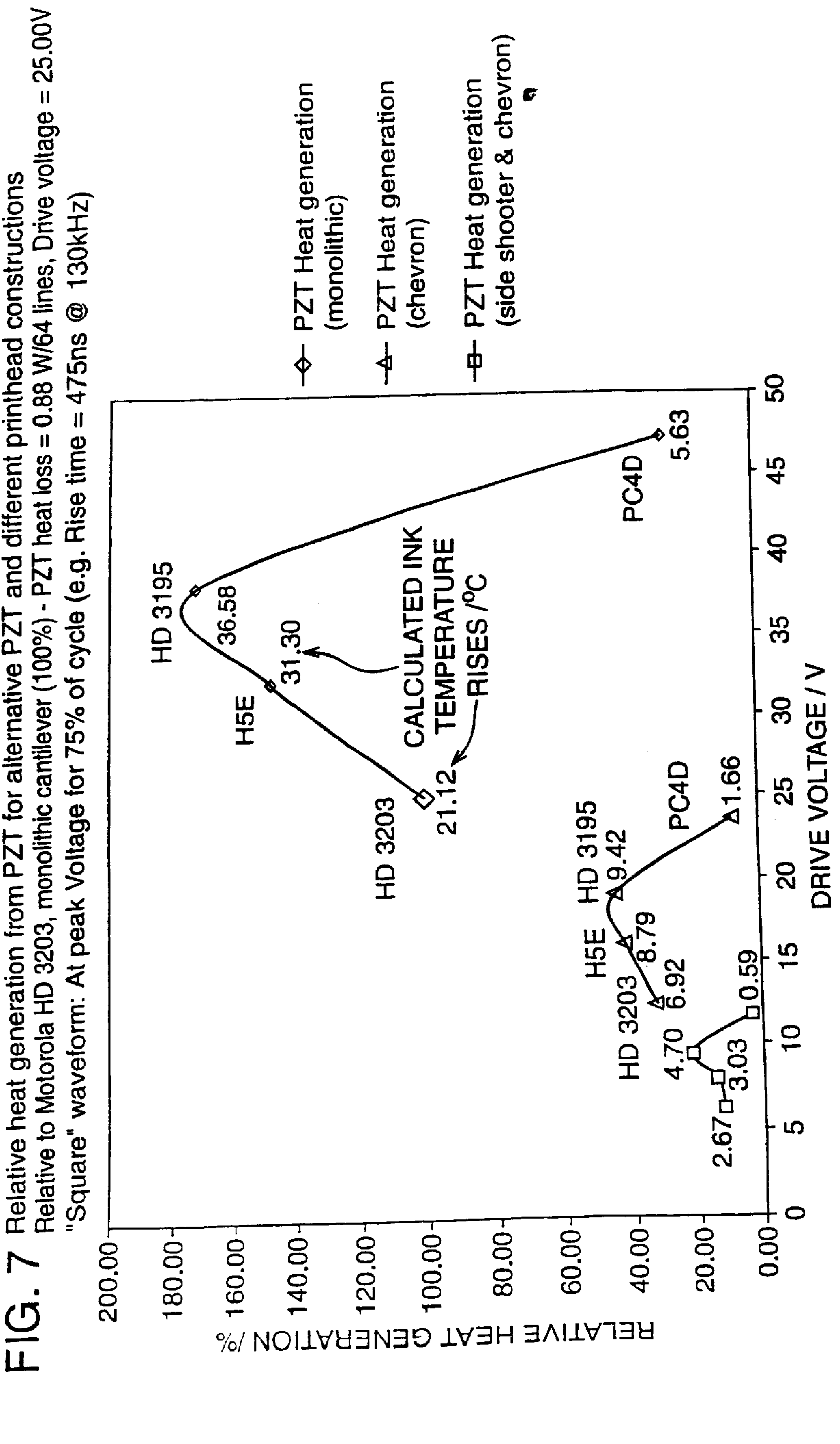
FIG. 7 Relative heat generation from PZT for alternative PZT and different printhead constructions

DROPLET DEPOSITION APPARATUS

This is a continuation of International Application No. PCT/GB00/00173 filed Jan. 24, 2000, the entire disclosure of which is incorporated herein by reference.

This invention relates to droplet deposition apparatus.

In particular the invention is concerned with a printer or other droplet deposition apparatus in which an acoustic pressure wave is generated by an electrical signal to eject a droplet of the liquid (e.g. ink) from a chamber. The apparatus may have a single such chamber, but more typically has a print head with an array of such chambers each with a respective nozzle, the print head receiving data-carrying electrical signals which provide the power necessary to eject droplets from the chambers on demand. The or each chamber is bounded by a piezo-electric element which is caused to deflect by the electrical signal, thereby generating the acoustic pressure wave which ejects the droplet. Reference is made to our published specifications EP 0277703, U.S. Pat. No. 4,887,100 and WO91/17051 for further details of typical constructions.

It is customary in such apparatus that the voltage of the electrical signal required to eject a droplet is minimized; lower voltages permit the driving circuitry to be simplified and/or reduced in cost. Furthermore, the heat generated during operation of the print head, which is proportional to $V^2$ in both the print head and its driving circuitry, is also minimised. Excessive heat generation is to be avoided because it affects the fluid properties of the ink, leading to inaccuracies in printing, especially if there are significant variations in temperature between different chambers of the print head. Such variations occur when one chamber is operating significantly more frequently than another, eg when one is printing a dense area of an image and the other a significantly less dense area. To this end, a soft (donor-doped) lead zirconate titanate (PZT) material often is the preferred piezo-electric material. Soft PZT has a high piezo-electric activity; that is to say a given voltage will produce a relatively large physical deformation of material, which is particularly effective in ejecting the liquid droplet from the chamber.

Further reductions in drive voltage can be achieved by arranging the piezo electric material in "chevron" configuration, as described in the context of an "end-shooter" print-head in our EP-A-277703. Alternatively or in addition, the print head can be configured as a "side shooter" as described in our WO91/17051. Both of these designs halve the drive voltage for a given droplet ejection performance relative to an "end-shooter" design employing a monolithic piezo electric element; adopting both of them reduces the drive voltage by a factor of four.

By "end-shooter" we mean a configuration in which the nozzle is at the end of elongated chamber, the piezo electric material being disposed along the sides of the chamber. In a side-shooter, the nozzle is instead disposed in one of the long sides of the chamber which is not bounded by piezo electric material. In a "chevron" design a longitudinal side of the chamber is bounded by piezo electric material having oppositely-poled regions extending longitudinally of the chamber, so that application of the electrical signal deforms both regions of the material of the same direction into a chevron shape, when viewed in cross-section.

Whilst the foregoing expedients may be thought to offer both low drive voltages and low heating effects, they have a serious disadvantages, namely that compared to a monolithic end-shooter, both of them approximately double the capacitance of the chamber wall, as seen by the drive circuit.

A chevron side shooter design thus has four times the capacitance of a comparable monolithic end-shooter. High capacitance has two effects. Firstly capacitance heating effects are increased with the disadvantages already discussed, and secondly the high capacitance increases the time constant (RC) of the device. The waveform of the driving electrical signals is preferably as close as possible to a square wave, so that the sharpness of the acoustic pressure waves is maximised. A large time constant increases the rise time of the circuit in response to a step change, with the result that its ability to produce an effectively square waveform at high frequencies is compromised. The frequency of the drive signals thus has to be limited, thereby reducing the speed at which the printer can be operated. This is particularly important in variable density ("grey scale") printers, in which each deposited droplet is made up of a controllable numbers of smaller sub-droplets produced at very high frequency.

The preferred embodiments of the present invention are directed to this problem.

The invention provides a droplet deposition apparatus comprising a liquid droplet ejection nozzle, a pressure chamber with which the nozzle communicates and from which the nozzle is supplied with liquid for droplet ejection, a wall of the chamber comprising a acceptor-doped piezo electric material deformable upon the application of an electrical signal to eject said droplet from the nozzle.

Preferably the material has a hysteresis loss (tan δ) of substantially not more than 0.05 at the voltage of the applied electrical signal.

The hysteresis loss tangent is given by $$\tan\delta = \epsilon''/\epsilon'$$

Where $\epsilon''$ is the imaginary part of the permittivity and $\epsilon'$ is the real part.

Preferably the material has a figure of merit (as herein defined) of between 15 and 30, and preferably of about 25.

By "figure of merit" we mean the quantity $$d_{15}/(S_{55}\cdot\epsilon_0)^{1/2}$$

$$\tan\delta = \epsilon''/\epsilon'$$

where $d_{15}$=shear strain/electric field piezo electric constant $S_{55}$=electric shear compliance $\epsilon_0$=permittivity of free space Examination of a range of PZT materials has shown the general trend that high figure of merit is associated both with high loss tangent and high relative permittivity.

As already indicated, the invention is particularly suitable for apparatus in which the piezo electric material is deformed in shear mode, the apparatus having one or preferably both of the "side shooter" and "chevron" configurations.

The preferred piezo electric material for use in the invention is an acceptor-doped PZT such as that sold by Morgan Matroc under the designation PC4D.

The invention will now be described merely by way of example with reference to the accompanying drawings, wherein:

FIG. 1 is a perspective view of a prior art monolithic end-shooter print head (with some parts removed for clarity) similar to FIG. 1 of U.S. Pat. No. 4,887,100.

FIG. 2 is a section through an end-shooter chevron print head similar to that of FIG. 2 of U.S. Pat. No. 4,887,100.

FIG. 5 shows the variation of tan δ with waveform for various materials.

FIG. 6 shows the variation in heat generation in print heads using different materials; and FIG. 7 shows the variation of heat generation in different PZT materials.

In order to place the invention in context, different types of droplet deposition device will first be described. In the drawings, like parts have been accorded the same numerical references.

Figure 1:
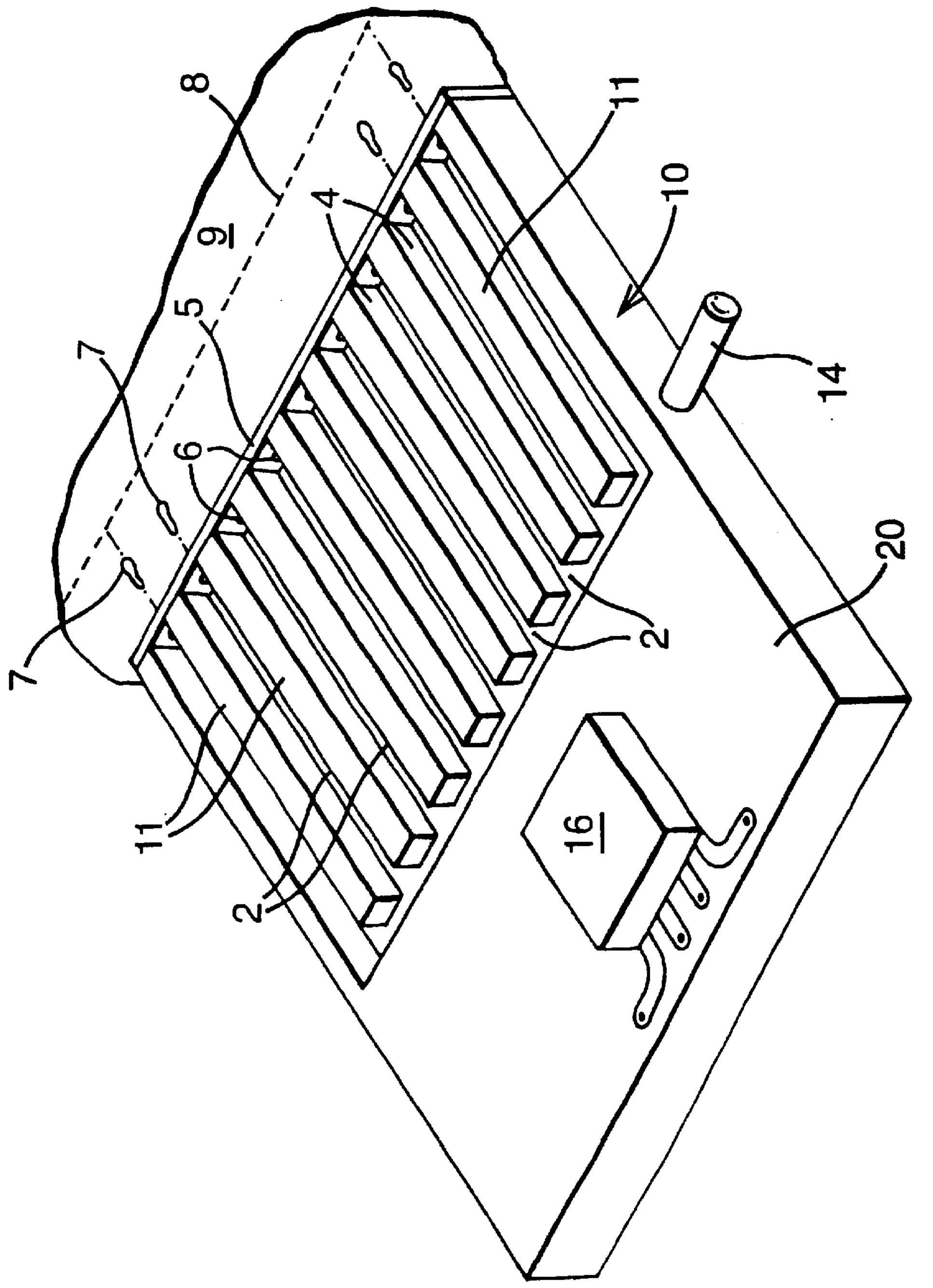

Referring first to FIG. 1, a planar array, drop-on demand ink jet printer comprises a printhead 10 formed with a multiplicity of parallel ink chambers or channels 2, nine only of which are shown and the longitudinal axes of which are disposed in a plane. The channels 2 are closed by a cover (not shown) which extends over the entire top surface of the print head.

The channels 2 contain ink 4 and are of end-shooter configuration, terminating at corresponding ends thereof in a nozzle plate 5 in which are formed nozzles 6, one for each channel. Ink droplets 7 are ejected on demand from the channels 2 and deposited on a print line 8 of a print surface 9 between which and the print head 10 there is relative motion normal to the plane of the channel axes.

The print head 10 has a planar base part 20 in which the channels 2 are cut or otherwise formed of a soft PZT piezo-electric material so as to extend in parallel rearwardly from the nozzle plate 5. The channels 2 are long and narrow with a rectangular cross-section and have opposite side walls 11 which extend the length of the channels. The side walls 11 are provided with electrodes (not shown) extending along the length of the channels whereby the side walls are displaceable in shear mode transversely relatively to the channel axes along substantially the whole of the length thereof, to cause changes of pressure in the ink in the channels to effect droplet ejection from the nozzle. The channels 2 connect at their ends remote from the nozzles, with a transverse channel (not shown) which in turn connects with an ink reservoir (not shown) by way of pipe 14. Electrical connections (not shown) for activating channel side walls 11 are made to an LSI chip 16 on the base part 20.

As illustrated in this figure, the channel side walls are monolithic with and effectively cantilevered from the base part 20, having been cut from a single piece of piezo-electric material.

Figure 2:
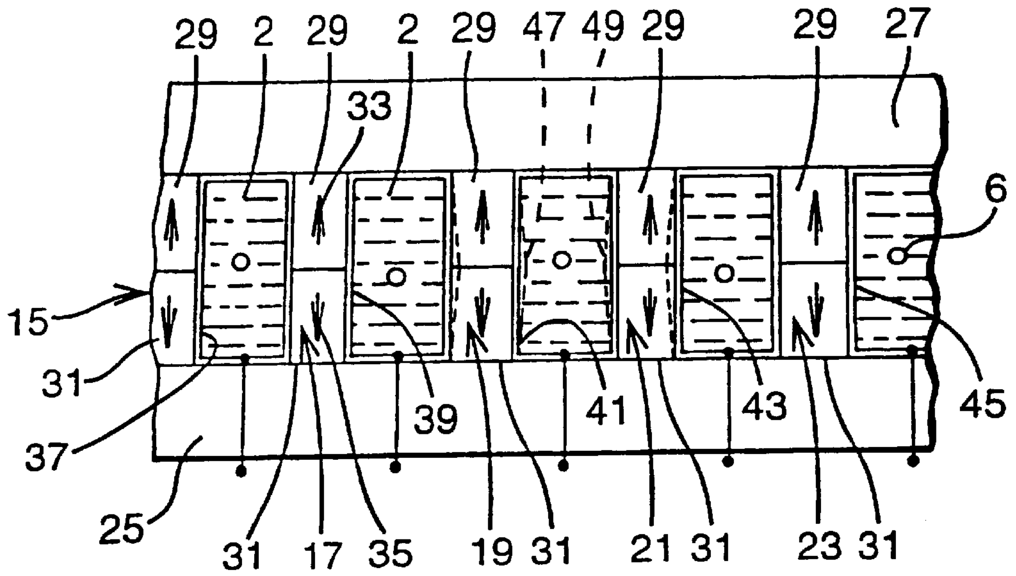

FIG. 2 shows a modified form of the print head of FIG. 1, in which the channel side walls 11 have oppositely—poled regions so that application of an electric field deflects them into a chevron shape. In FIG. 2 the array incorporates displaceable side walls 11 in the form of shear mode actuators 15, 17, 19, 21 and 23 sandwiched between base and top walls 25 and 27 and each formed of upper and lower wall parts 29 and 31 which, as indicated by arrows 33 and 35, are poled in opposite senses normal to the plane containing the channel axes. Electrodes 37, 39, 41, 43 and 45 respectively cover all inner walls of the respective channels 2. Thus, when a voltage is applied to the electrode of a particular channel, say electrode 41 of the channel 2 between shear mode actuator 19 and 21, whilst the electrodes 39 and 43 of the channels 2 on either side of that of electrode 41 are held to ground, an electric field is applied in opposite senses to the actuators 19 and 21. By virtue of the opposite poling of the upper and lower wall parts 29 and 31 of each actuator, these are deflected in shear mode into the channel 2 therebetween into chevron form as indicated by broken lines 47 and 49. An impulse is thus applied to the ink 4 in the channel 2 between the actuators 19 and 21 which causes an acoustic pressure wave to travel along the length of the channel and eject an ink droplet 7 therefrom.

Figure 3:
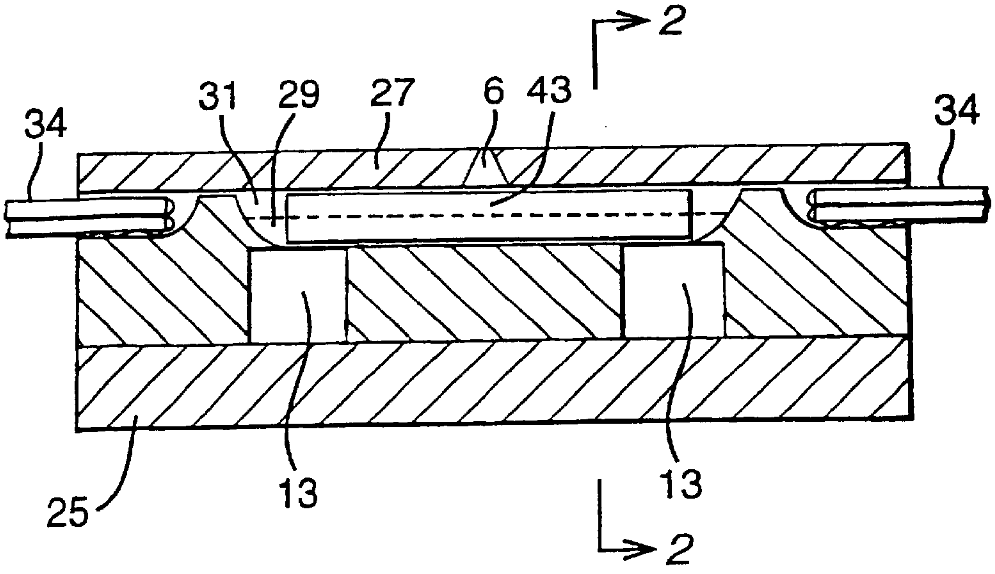
FIG. 3 is a longitudinal section through a side-shooter chevron print head according to the invention.

FIG. 3 shows a longitudinal section through a side-shooter print head. The nozzle 6 is provided in the cover 27 which forms the top wall of the channel, and communicates with channel 2, the sides of which are bounded by side walls of PZT material in the form of shear mode actuators, one of which is shown at 21. As in FIG. 2, each shear mode actuator has oppositely poled regions 29, 31 which deflect into a chevron shape when subjected to an electric field by electrodes (41, 43) on its longitudinal surfaces. Terminations 34 connect the electrodes to the LSI chip 16. Transverse channels 13 connect the channel 2 at each end to an ink reservoir. Except for the position of the nozzles 6, the print head is similar in cross-section on line 2.2 to FIG. 2.

It also is similar to FIG. 1(*d*) of our specification WO 91/17051, except for the inventive choice of piezo electric material which will now be described, and for the use of chevron type shear mode actuators, although monolithic actuators poled in a single direction may be used instead in a side shooter print head according to the invention.

PZT materials are of two basic types, "soft" or donor-doped, and "hard" or acceptor-doped. As discussed in "Electroceramics" by A. J. Moulson (Chapman & Hall, 1990), donor doping (doping with ions of higher charge than those they replace) reduces the concentration of domain-stabilising defect pairs and so to lower ageing rates. The resulting increase in domain wall mobility increases permittivity, hysteresis loss (tan δ), elastic compliance and coupling coefficients. Mechanical Q and coercivity are reduced. The consequent high piezo-electric activity makes soft PZT the conventional material of choice for piezo electric print heads.

In contrast, acceptor doping of PZT inhibits domain wall movement, resulting in reduced permittivity, hysteresis loss (tan δ), elastic compliance and coupling co-efficients, and an increase in coercivity. The material thus exhibits less piezo-electric activity, and consequently has not hitherto been used for piezo-electric print heads.

We have analyzed the performance of a number of PZT materials, and have made the surprising discovery that in some circumstances, a hard material may be a more appropriate choice than soft one.

Four specimen PZT materials were chosen for analysis—namely, Motorola HD 3202, Sumitomo H5E, Motorola HD3195 and Morgan Matroc PC4D. They were selected so that they covered the range of available actuator materials and were evenly spaced in terms of shear mode piezoelectric activity. The shear mode activity is characterised by the dimensionless figure of merit—$d_{15}/(S_{55}\times\epsilon_0)^{1/2}$, which is equivalent to the converted electromechanical energy per unit volume per unit volt. In terms of piezoelectric activity the materials are ranked HD3203>H5E>HD3195>PC4D, where the measured low signal figures of merit are 48.2, 37.4, 31.5 and 25.7 respectively.

Four wafers of 128-line printheads were manufactured from the four PZT's, and capacitance and hysteresis loss measurements were carried out on printheads, under typical operating conditions, as follows:

| | |
|---|---|
| Drive Voltage: | 10–50 V. |
| Drive Frequency: | 20, 50, 100 & 200 kHz |
| Drive Waveform type: | Substantially square wave (voltage at peak for 75% of cycle) |
| Printhead Temperature: | 18° C., 40° C., 50° C. (measurements were made in short bursts and the temperature of the printhead was assumed not to increase significantly). |

Hysteresis loss (tan δ) measurements were made by the method described in the paper "Dielectric Non-Linearity in Hard Piezoelectric Ceramics" by D A Hall, P J Stevenson and T R Mullins (Vol. 57 Brit. Cer. Proc. p197–211).

These measurements showed that for a given material, capacitance and hysteresis does not vary with frequency. However there is a significant increase in both capacitance and hysteresis loss (tan δ) with drive voltage.

Figure 4:
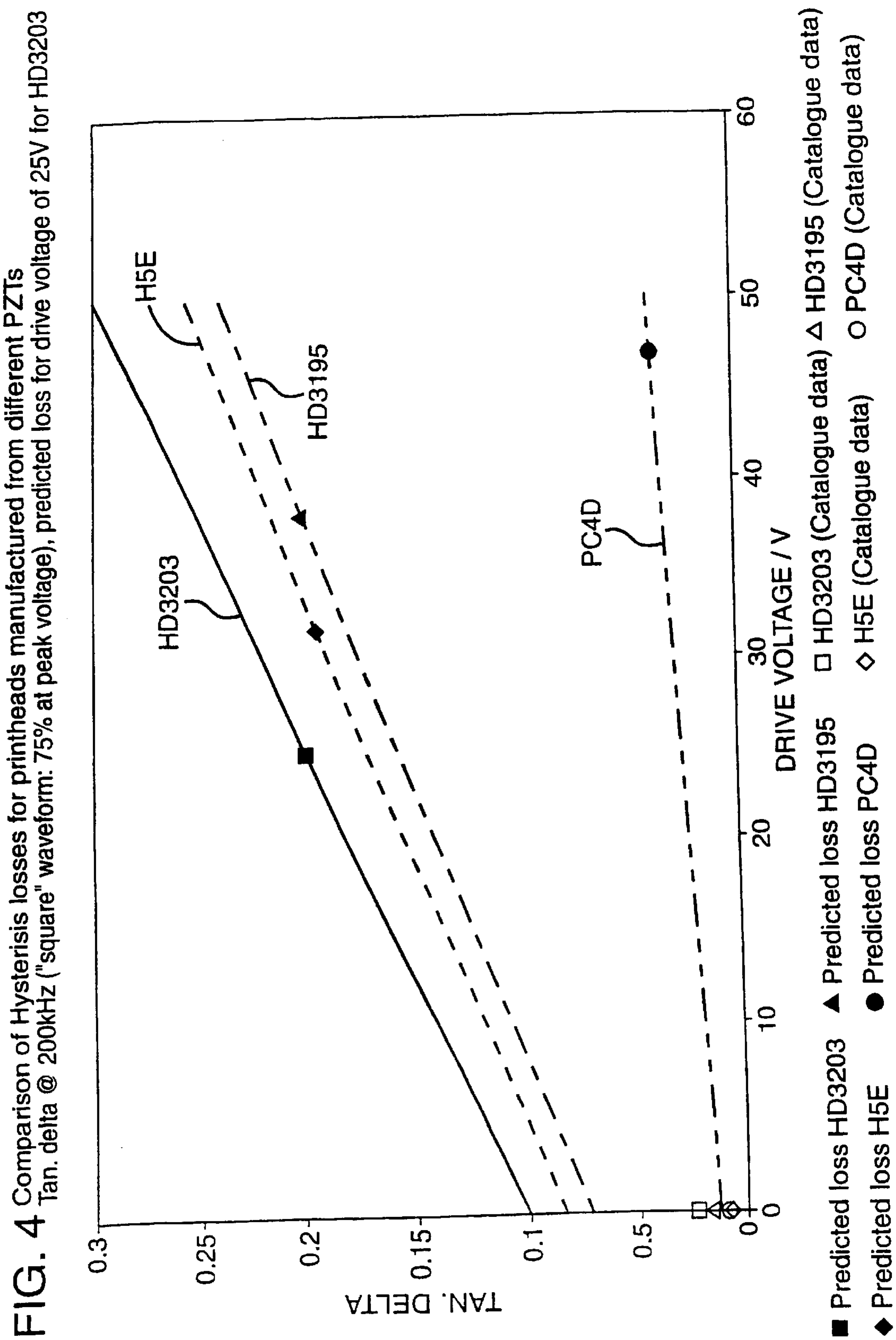
FIG. 4 shows the variation of tan δ with drive voltage for various materials.

A comparison for the four PZTs of the variation of tan δ with drive voltage at 200 kHz is given in FIG. 4. Also given in FIG. 4 are the manufacturer's quoted low field catalogue data for each material. The results show that the three "softer" PZTs have similar characteristics, with a significant increase in tan δ with drive voltage. Also, there is a large difference between the quoted "catalogue", low field tan δ and that for the drive voltage required for printhead operation (around 25V). In contrast, the "hardest" PZT, PC4D, shows a much lower tan δ and a reduced variation with drive voltage.

The hysteresis losses for an equivalent printhead drive voltage of 25V for HD 3203 are also given in FIG. 4, lower activity PZTs requiring higher drive voltage. They show that, for equivalent printhead operating conditions, HD3203, H5E and HD3195 have similar losses, with the predicted hysteresis loss for PC4D being considerably lower, and not exceeding 0.05, compared to four or five times that figure for the other materials.

The equivalent drive voltage V was calculated using the relative figure of merit M of each PZT, for example $$V_{H5E}=V_{HD3203}M_{HD3203}/M_{H5E}$$

Measurements were also taken with varying waveform types at a fixed frequency and drive voltage. FIG. 5 shows the effect of the transition between a triangular waveform (0% at peak voltage) and a square wave (ideally 100% at peak voltage but in practice less) for a constant drive voltage (30V) and a fixed drive frequency of 200 kHz. Unlike drive frequency, wave form type has a significant effect on tan δ, e.g. tan δ for HD3203 increases by 85% when changing from a triangular waveform to a waveform with the voltage at its peak for 87.5% of the cycle. This is consistent with the increased heat generation from the PZT when the printhead is driven by a square waveform.

The hysteresis loss/drive voltage results were used to calculate the heat generated within different designs of printheads. The heat generated within the printhead and the proportion within the PZT was calculated for the four types of PZT. This was done for three printhead constructions; a conventional monolithic cantilever end-shooter, a chevron end-shooter, and a chevron side-shooter. The drive voltages for the latter two cases were assumed to be 0.5 times and 0.25 times respectively, compared to the monolithic cantilever, whereas the capacitances were assumed to be 2 times and 4 times respectively. A spreadsheet model was used to calculate these configurations for different operating conditions. The calculations were based on the following assumptions:

1. Heat generated within drive circuitry per charging/discharging edge=$2\times\frac{1}{2}CV^2$ (two walls, each of capacitance C, actuated for each drop ejected).
2. The proportion of heat dissipated within PZT per channel=$\pi CV^2 \tan\delta/2$.
3. The drive circuit rise time (10–90%)=6.6 RC (for walls of capacitance C, connected in parallel, charged from and discharging into an impedance R).
4. Maximum temperature rise for ink analogue=Heat generated/specific heat capacity×Drop Volume (assumes all heat generated within PZT is removed with ejected drop).

The following set of parameters were assumed for a typical Greyscale operating condition:

| | |
|---|---|
| Drive Voltage (V) = | 25 V (for monolithic cantilever HD 3203, and proportioned as discussed above for the other materials) |
| Wall Capacitance (C) = | 200 pF |
| Greyscale Levels (L) = | 8 levels |
| Firing Sequence: | Triple Cycle (i.e. the channels are fired in three interleaved groups) |
| Waveform Type: | DRR (Draw, Release, Reinforce, as shown in FIG. 4c of our specification WO95/25011). |
| Line Frequency (F) | 6.19 kHz (Droplet Frequency = 130 kHz) |
| Full Density Drop Volume = | 55 pl |

The total heat generated has been calculated per driver chip (i.e. per 64 lines) and a ratio has been calculated to the base case (HD3203, monolithic cantilever) for each configuration. The results for each case are summarised in FIGS. 6 and 7. The former shows the total heat generated within the drive circuitry along with the calculated rise time, and the latter shows the heat generated within PZT alone, along with the temperature rise of the ink.

It can be seen from FIG. 7 that the heat generated in the print head material is lowest in all cases when the PC4D material is used, although the drive voltage is higher. From FIG. 6 it is evident that when the heat generated in the driver chip also is taken into account the total heat generated in the printhead is lowest with the conventionally—preferred HD3203, but that the PC4D printhead is not significantly worse than that using the next-best material H5E. The drive voltage required for the PC4D material is greater, but the rise time is uniformly less than one half of that for the HD3203 material in the same print head configuration. In absolute terms, the heat generated in the chevron end shooter is less than that generated in the monolithic end shooter by a factor of more than two and the heat generated in the chevron side-shooter generally is less again by about the same factor. However, the rise times of the chevron end-shooter and chevron side-shooter are greater than those of the monolithic end-shooter by about the same factors.

Whilst these results prima facie point to the HD3203 material continuing to be the most suitable, in fact there are circumstances in which counter-intuitive choice of PC4D can bring advantages.

Thus, if a fast rise time is required, and a high drive voltage and heat generation can be tolerated, PC4D in a monolithic end shooter is easily the best (145 ms compared to 316 ms for HD3203).

If an improvement in rise time compared to HD3203 is required, and at the same reduced heat generation, the use of PC4D in a chevron end shooter is indicated. The rise time is reduced from 356 to 251 ms, and the heat generated is reduced by 40%. A similar result could be expected if PC4D is used in a monolithic side-shooter.

For a reasonable rise time (456 ms compared to 356 ms of a monolithic end shooter) combined with very low heat generation (only about 30% of the baseline case) and low driving voltage (12 v compared to 25 v) PC4D should be used in a chevron side-shooter configuration. In such a print head the temperature rise of the ink would be negligible at about 0.5° C., compared to 21° C. in a monolithic end-shooter using HD3203. A PC4D print head configured as a chevron side-shooter thus would be very well suited for high-definition grey-scale printer, because there would be little if any thermally-induced variation in droplet velocity with print density.

Whilst the invention has been described in the context of PC4D material, other acceptor-doped piezo-electric materials may exhibit the same characteristics and advantages.

Each feature disclosed in this specification (which term includes the claims) and/or shown in the drawings may be incorporated in the invention independently of other disclosed and/or illustrated features.

Statements in this specification of the "objects of the invention" relate to preferred embodiments of the invention, but not necessarily to all embodiments of the invention falling within the claims.

The text of the abstract filed herewith is repeated here as part of the specification.

An acceptor-doped "hard" PZT is used in a piezo-electric print head instead of the conventional "soft" donor-doped material. The print head preferably is of a chevron side-shooter configuration and is advantageous for high-definition grey-scale printing.

What is claimed is:

1. A droplet deposition apparatus comprising a liquid droplet ejection nozzle, a pressure chamber with which the nozzle communicates and from which the nozzle is supplied with liquid for droplet ejection, a wall of the chamber comprising an acceptor-doped piezo electric material having a figure of merit of between 15 and 30 and being deformable upon the application of an electrical signal to eject said droplet from the nozzle.

2. Apparatus as claimed in claim 1 wherein the material has a hysteresis loss tangent (tan δ) of substantially not more than 0.05 at the voltage of the applied electrical signal.

3. Apparatus as claimed in claim 2 wherein the material has a figure of merit of about 25.

4. Apparatus as claimed in claim 1 wherein the nozzle is disposed in a further wall of the chamber, intermediate the ends of the chamber.

5. Apparatus as claimed in claim 1 wherein the piezo-electric material is such that application of the electrical signal deforms it in shear mode to generate an acoustic pressure wave in the chamber and thereby eject said droplet.

6. Apparatus as claimed in claim 5 wherein the piezo-electric material in said wall has two regions extending side by side, said regions being poled such that application of the electrical signal deforms said regions into a chevron form, viewed in cross section.

7. Apparatus as claimed in claim 1 wherein the piezo-electric material is PZT.

8. Apparatus as claimed in claim 1 wherein the material has a figure of merit of about 25.

* * * * *